(12) United States Patent
Yoshida et al.

(10) Patent No.: US 10,886,747 B2
(45) Date of Patent: Jan. 5, 2021

(54) POWER GENERATION ELEMENT, POWER GENERATION MODULE, POWER GENERATION DEVICE, AND POWER GENERATION SYSTEM

(71) Applicant: KABUSHIKI KAISHA TOSHIBA, Minato-ku (JP)

(72) Inventors: Hisashi Yoshida, Kawasaki (JP); Shigeya Kimura, Yokohama (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 45 days.

(21) Appl. No.: 16/262,990

(22) Filed: Jan. 31, 2019

(65) Prior Publication Data

US 2020/0028365 A1 Jan. 23, 2020

(30) Foreign Application Priority Data

Jul. 18, 2018 (JP) .................................. 2018-135178

(51) Int. Cl.
| | |
|---|---|
| *H02J 3/38* | (2006.01) |
| *H02S 20/32* | (2014.01) |
| *H01L 31/02* | (2006.01) |
| *H01L 31/0304* | (2006.01) |
| *H01L 31/032* | (2006.01) |

(52) U.S. Cl.
CPC ........ *H02J 3/385* (2013.01); *H01L 31/02008* (2013.01); *H01L 31/0324* (2013.01); *H01L 31/03044* (2013.01); *H02S 20/32* (2014.12)

(58) Field of Classification Search
CPC .... H02J 3/385; H02S 20/32; H01L 31/02008; H01L 31/03044; H01L 31/0324
See application file for complete search history.

(56) References Cited

U.S. PATENT DOCUMENTS

| | | | |
|---|---|---|---|
| 6,350,999 B1 | 2/2002 | Uenoyama et al. | |
| 7,605,527 B2 | 10/2009 | Sakai et al. | |
| 2011/0291109 A1* | 12/2011 | Wraback | H01L 31/0312 257/77 |

(Continued)

FOREIGN PATENT DOCUMENTS

| | | |
|---|---|---|
| JP | 2000-323015 | 11/2000 |
| JP | 2005-346954 | 12/2005 |

(Continued)

*Primary Examiner* — Jayne L Mershon
(74) *Attorney, Agent, or Firm* — Oblon, McClelland, Maier & Neustadt, L.L.P.

(57) ABSTRACT

According to one embodiment, a power generation element includes a first conductive layer, a second conductive layer, a first member provided between the first conductive layer and the second conductive layer, and a second member separated from the first member and provided between the first member and the second conductive layer. The first member includes a first region including $Al_{x1}Ga_{1-x1}N$ ($0 \leq x1 < 1$), and a second region including $Al_{x2}Ga_{1-x2}N$ ($x1 < x2 \leq 1$) and being provided between the first region and the second member. A <000-1> direction of the first member has a component in an orientation from the first conductive layer toward the second conductive layer.

19 Claims, 7 Drawing Sheets

(56) References Cited

U.S. PATENT DOCUMENTS

| | | | |
|---|---|---|---|
| 2015/0140710 A1* | 5/2015 | McLaurin | H01S 5/0217 |
| | | | 438/31 |
| 2016/0285391 A1* | 9/2016 | Asanuma | H02N 1/08 |
| 2018/0337317 A1 | 11/2018 | Kimura et al. | |
| 2019/0013439 A1* | 1/2019 | Sung | H01L 33/20 |

FOREIGN PATENT DOCUMENTS

| | | |
|---|---|---|
| JP | 2012-190990 | 10/2012 |
| JP | 2013-229971 | 11/2013 |
| JP | 2018-195790 | 12/2018 |

\* cited by examiner

POWER GENERATION ELEMENT, POWER GENERATION MODULE, POWER GENERATION DEVICE, AND POWER GENERATION SYSTEM

CROSS-REFERENCE TO RELATED APPLICATIONS

This application is based upon and claims the benefit of priority from Japanese Patent Application No. 2018-135178, filed on Jul. 18, 2018; the entire contents of which are incorporated herein by reference.

FIELD

Embodiments described herein relate generally to a power generation element, a power generation module, a power generation device, and a power generation system.

BACKGROUND

For example, there is a power generation element including an emitter electrode to which heat is applied from a heat source, and a collector electrode capturing thermions from the emitter electrode. It is desirable to increase the efficiency of the power generation element.

DETAILED DESCRIPTION

Figure 1A:
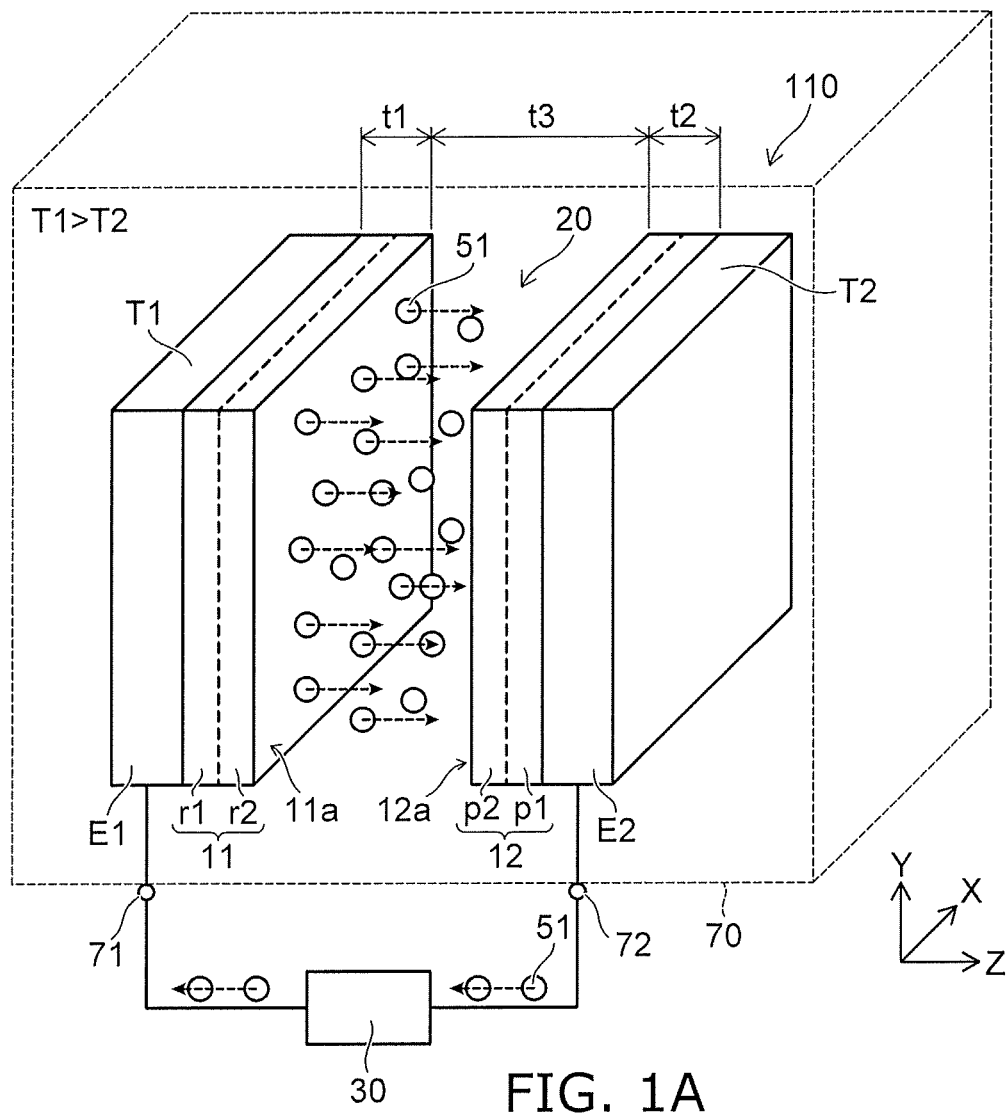
FIG. 1A to FIG. 1C are schematic perspective views illustrating a power generation element according to a first embodiment.

According to one embodiment, a power generation element includes a first conductive layer, a second conductive layer, a first member provided between the first conductive layer and the second conductive layer, and a second member separated from the first member and provided between the first member and the second conductive layer. The first member includes a first region including $Al_{x1}Ga_{1-x1}N$ ($0 \leq x1 < 1$), and a second region including $Al_{x2}Ga_{1-x2}N$ ($x1 < x2 \leq 1$) and being provided between the first region and the second member. A <000-1> direction of the first member has a component in an orientation from the first conductive layer toward the second conductive layer.

According to another embodiment, a power generation module includes a plurality of the power generation elements described above.

According to another embodiment, a power generation device includes a plurality of the power generation modules described above.

According to another embodiment, a power generation system includes the power generation device described above and a drive device. The drive device causes the power generation device to follow a movement of the sun.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
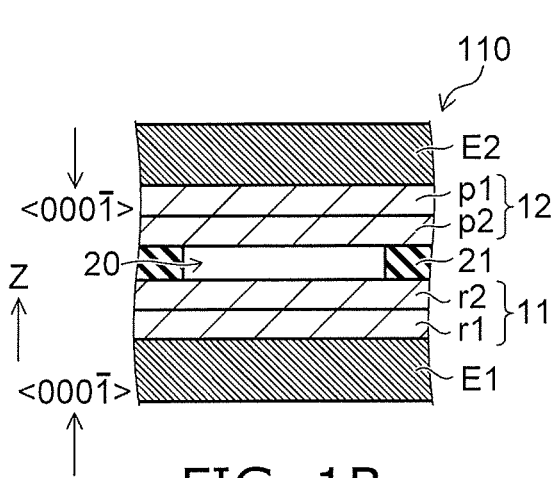
Figure 1C:
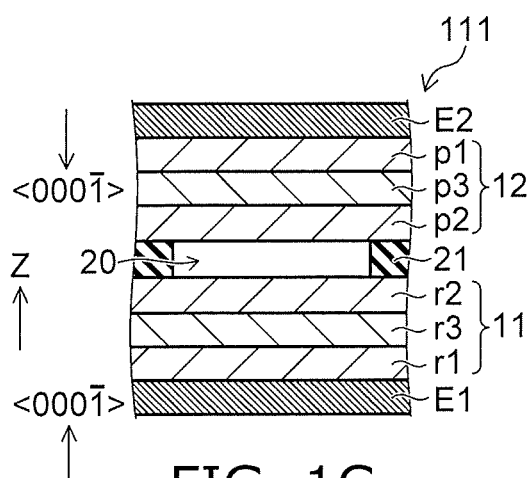

FIG. 1A to FIG. 1C are schematic perspective views illustrating a power generation element according to a first embodiment.

As shown in FIG. 1A, the power generation element 110 according to the first embodiment includes a first conductive layer E1, a second conductive layer E2, a first member 11, and a second member 12.

The first member 11 is provided between the first conductive layer E1 and the second conductive layer E2. The second member 12 is provided between the first member 11 and the second conductive layer E2. The second member 12 is separated from the first member 11. For example, a gap 20 is provided between the first member 11 and the second member 12.

In one example, the gap 20 is in a reduced-pressure state. For example, a container 70 is provided. For example, the first member 11 and the second member 12 are provided in the interior of the container 70. The interior of the container 70 is set to a reduced-pressure state. Thereby, the gap 20 is in a reduced-pressure state.

The first member 11 includes a first region r1 and a second region r2. The first region r1 includes $Al_{x1}Ga_{1-x1}N$ ($0 \leq x1 < 1$). The second region r2 includes $Al_{x2}Ga_{1-x2}N$ ($x1 < x2 \leq 1$). The second region r2 is provided between the first region r1 and the second member 12. In one example, the first region r1 may include, for example, GaN. The second region r2 may include, for example, AlN.

Multiple regions may be provided in the second member 12. In the example, the second member 12 includes a first opposing region p1 and a second opposing region p2. The first opposing region p1 includes $Al_{y1}Ga_{1-y1}N$ ($0 \leq y1 < 1$). The second opposing region p2 includes $Al_{y2}Ga_{1-y2}N$ ($y1 < y2 \leq 1$). The second opposing region p2 is provided between the first opposing region p1 and the first member 11. For example, the gap 20 is provided between the second region r2 and the second opposing region p2.

For example, the first member 11 has a first surface 11a. The first surface 11a opposes the second member 12. For example, the second member 12 has a second surface 12a. The second surface 12a opposes the first member 11.

The direction from the first member 11 toward the second member 12 is taken as a Z-axis direction. The Z-axis direction corresponds to the direction from the first conductive layer E1 toward the second conductive layer E2. One direction perpendicular to the Z-axis direction is taken as an X-axis direction. A direction perpendicular to the Z-axis direction and the X-axis direction is taken as a Y-axis direction.

In the example, the first member 11 and the second member 12 have film configurations spreading along the X-Y plane. In the embodiment, the configurations of the first member 11 and the second member 12 are arbitrary.

A thickness t1 of the first member 11 is, for example, not less than 1 nm and not more than 3000 nm. A thickness t2 of the second member 12 is, for example, not less than 1 nm and not more than 3000 nm. The distance between the first member 11 and the second member 12 corresponds to a thickness t3 of the gap 20. The thickness t3 is, for example, not less than 0.1 μm and not more than 50 μm. These thicknesses are distances along the Z-axis direction.

As shown in FIG. 1B, a spacer 21 may be provided between the first member 11 and the second member 12. The spacer 21 is insulative. The gap 20 is formed by the spacer 21.

At least a portion of the first member 11 is a crystal. At least a portion of the second member 12 may be a crystal.

The <000-1> direction of the first member 11 has a component in the orientation from the first conductive layer E1 toward the second conductive layer E2. The orientation is the same as the orientation from the first member 11 toward the second member 12. The "-" corresponds to a "bar" in the notation of "<000-1>." For example, the <000-1> direction is the reverse of the <0001> direction.

In one example, the <000-1> direction of the second member 12 has a component in the orientation from the second conductive layer E2 toward the first conductive layer E1. Thus, in one example according to the embodiment, the orientation of the crystal of the first member 11 may have a component that is the reverse of the orientation of the crystal of the second member 12. For example, the member that is used as the first member 11 may be used as the second member 12 by changing the orientation. Thereby, a high power generation efficiency is obtained.

For example, the first surface 11a is, for example, the (000-1) plane. The first surface 11a may be a semi-polar plane. The second surface 12a is, for example, the (000-1) plane. The second surface 12a may be a semi-polar plane.

For example, the first member 11 is electrically connected to the first conductive layer E1. The second member 12 is electrically connected to the second conductive layer E2.

As shown in FIG. 1A, for example, a first terminal 71 and a second terminal 72 are provided. The first terminal 71 is electrically connected to the first conductive layer E1. The second terminal 72 is electrically connected to the second conductive layer E2. A load 30 is electrically connectable between the first terminal 71 and the second terminal 72.

For example, the temperature of the first conductive layer E1 (and the first member 11) is taken as a first temperature T1.

The temperature of the second conductive layer E2 (and the second member 12) is taken as a second temperature T2. For example, the temperature (the first temperature T1) of the first member 11 is caused to be higher than the temperature (the second temperature T2) of the second member 12. For example, the first conductive layer E1 (and the first member 11) are connected to a heat source, etc. Thereby, the first temperature T1 becomes higher than the second temperature T2. Thereby, electrons 51 are emitted from the first member 11. The electrons 51 are, for example, thermions. The electrons 51 travel toward the second member 12. The electrons 51 reach the second member 12.

The electrons 51 that reach the second member 12 flow into the load 30 via the second conductive layer E2 and the second terminal 72. The flow of the electrons 51 corresponds to a current.

Thus, in the power generation element 110, the temperature difference between the first conductive layer E1 (and the first member 11) and the second conductive layer E2 (and the second member 12) can be converted into a current.

The first conductive layer E1 (and the first member 11) is, for example, an emitter. The second conductive layer E2 (and the second member 12) is, for example, a collector.

A high power generation efficiency is obtained because the first member 11 has an orientation (a polarity) of the crystal such as that recited above. In the embodiment, multiple regions (e.g., the first region r1 and the second region r2) that have mutually-different Al composition ratios are provided in the first member 11. The electrons 51 are emitted efficiently because the Al composition ratio in the second region r2 is high. A good electrical contact between the first region r1 and the first conductive layer E1 is obtained easily because the Al composition ratio in the first region r1 is low. According to the embodiment, a power generation element can be provided in which the efficiency can be increased.

In the power generation element 110 illustrated in FIG. 1A and FIG. 1B, two regions (the first region r1 and the second region r2) are provided in the first member 11. In the embodiment, the number of multiple regions provided in the first member 11 is arbitrary.

For example, in a power generation element 111 according to the embodiment as illustrated in FIG. 1C, the first member 11 includes a third region r3 in addition to the first region r1 and the second region r2. The third region r3 is provided between the first region r1 and the second region r2. Other regions may be further provided in addition to the third region r3 between the first region r1 and the second region r2. The boundaries between these regions may be distinct or indistinct.

In the example of the power generation element 111, the second member 12 includes a third opposing region p3 in addition to the first opposing region p1 and the second opposing region p2. The third opposing region p3 is provided between the first opposing region p1 and the second opposing region p2. Other regions may be further provided in addition to the third opposing region p3 between the first opposing region p1 and the second opposing region p2. The boundaries between these regions may be distinct or indistinct. Examples of the regions provided in these members are described below.

In one example according to the embodiment, at least a portion of the first member 11 includes at least one element selected from the group consisting of Si, Ge, Te, and Sn. For example, the element functions as an n-type impurity. For example, the first region r1 includes this n-type impurity (the at least one element selected from the group consisting of Si, Ge, Te, and Sn). The second region r2 (and the third region r3, etc.) also may include this n-type impurity (the at least one element selected from the group consisting of Si, Ge, Te, and Sn).

Also, at least a portion of the second member 12 may include the n-type impurity recited above. For example, at least one of the first to third opposing regions p1 to p3 may include the n-type impurity recited above (the at least one element selected from the group consisting of Si, Ge, Te, and Sn).

In one example, the concentration of the n-type impurity of at least a portion of the member recited above (e.g., the first member 11 and the second member 12) is, for example, not less than $1\times10^{17}/cm^3$ and not more than $1\times10^{20}/cm^3$. For example, the electrical resistances of these members (e.g., the first member 11 and the second member 12) can be low; and good power generation characteristics are obtained.

Examples of simulation results of characteristics of the power generation device will now be described. The simulation results that relate to a first model and a second model will now be described.

In the first model, the first conductive layer E1 and the second conductive layer E2 are Mo. In the first region r1 of the first member 11, the Al composition ratio along the orientation from the first member 11 toward the second member 12 increases from 0 to 1. The increase of the Al composition ratio is linear with respect to the position in the thickness direction (the position in the Z-axis direction). The second region r2 is AlN. On the other hand, in the first opposing region p1 of the second member 12, the Al composition ratio along the orientation from the second member 12 toward the first member 11 increases from 0 to 1. The increase of the Al composition ratio is linear with respect to the position in the thickness direction (the position in the Z-axis direction). The second opposing region p2 is AlN. The first region r1 and the first opposing region p1 are Al graded layers. The thicknesses of the first region r1 and the first opposing region p1 each are 0.52 μm. The thicknesses of the second region r2 and the second opposing region p2 each are 1.0 μm. The first temperature T1 is 800 K. The second temperature T2 is 300 K.

In the second model, the first region r1 and the first opposing region p1 are not provided. The first member 11 and the second member 12 each are AlN layers having thicknesses of 1.52 μm. Otherwise, the configuration of the second model M2 is the same as the configuration of the first model M1.

In the first model and the second model, the carrier concentrations of the first member 11 and the second member 12 are $2\times10^{18}/cm^3$. In these models, substantially Schottky contacts are applied between the first conductive layer E1 and the first member 11 and between the second conductive layer E2 and the second member 12.

FIG. 2A to FIG. 2D are graphs illustrating characteristics of the power generation element.

Figure 2A:
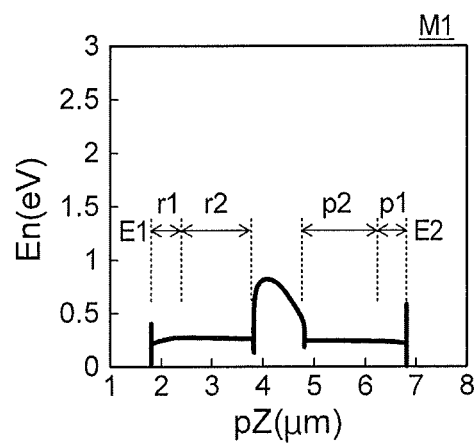
FIG. 2A to FIG. 2D are graphs illustrating characteristics of the power generation element.
Figure 2B:
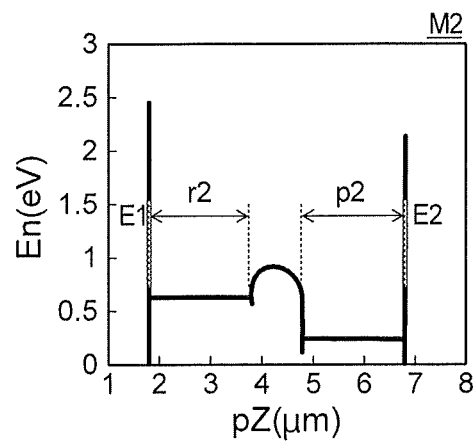
Figure 2C:
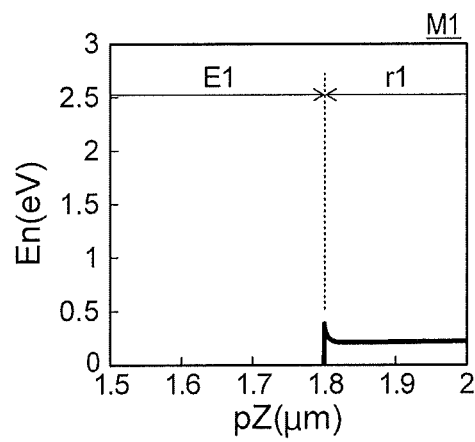
Figure 2D:
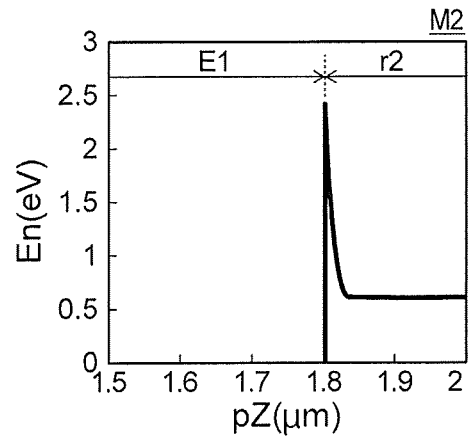

FIG. 2A and FIG. 2C correspond to the first model M1. FIG. 2C shows an enlargement of a portion of FIG. 2A. FIG. 2B and FIG. 2D correspond to the second model M2. FIG. 2D shows an enlargement of a portion of FIG. 2B. In these figures, the horizontal axis is a position pZ (μm) along the Z-axis direction. The vertical axis is an energy En (eV). The energy En of the conduction band is shown in these figures.

As shown in FIG. 2A and FIG. 2C, in the first model M1 in which the first region r1 (the Al-composition graded layer) is provided, the height of the peak of the energy En occurring at the portion between the first conductive layer E1 and the first region r1 is small. In such a case, for example, the electrons 51 move easily from the first conductive layer E1 toward the first region r1.

In the second model M2 in which the first region r1 is not provided as shown in FIG. 2B and FIG. 2D, the height of the peak of the energy En occurring at the portion between the first conductive layer E1 and the first region r1 is markedly high. In such a case, for example, it is difficult for the electrons 51 to move from the first conductive layer E1 toward the first region r1.

A current density of 12.9 A/cm² is obtained for the first model M1. The current density is substantially 0 for the second model M2.

Thus, a high current density is obtained by reducing the Schottky barrier height on the first conductive layer E1 side.

In the embodiment, it is favorable for good contact characteristics to be obtained between the first conductive layer E1 and the first member 11 and between the second conductive layer E2 and the second member 12. Thereby, a high current density is obtained.

Figure 3:
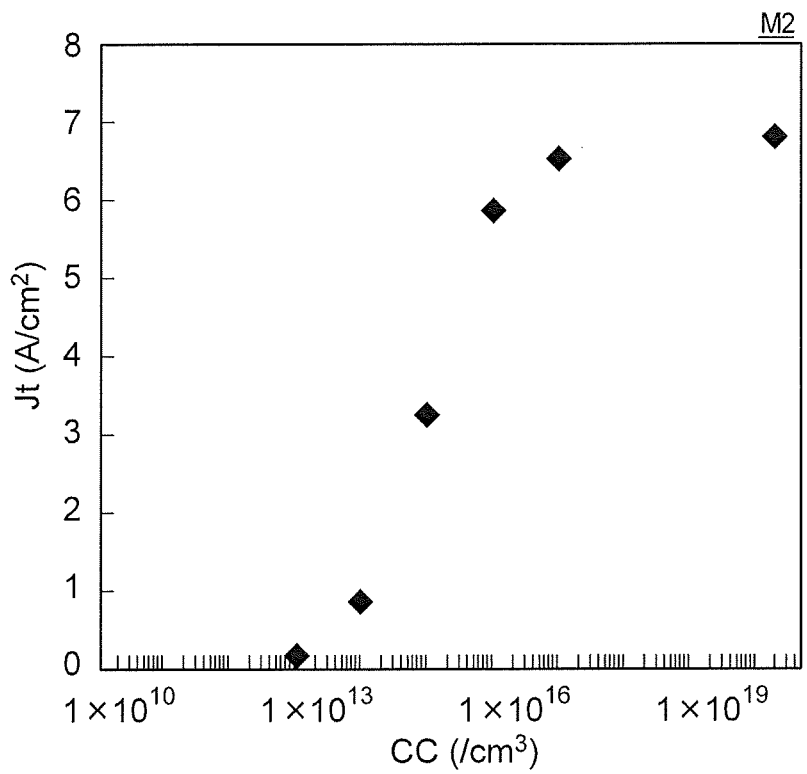
FIG. 3 is a graph illustrating a characteristic of the power generation element.

FIG. 3 is a graph illustrating a characteristic of the power generation element.

FIG. 3 illustrates simulation results relating to the second model M2 recited above. In the example, the first conductive layer E1 and the second conductive layer E2 are Mo. The first member 11 and the second member 12 each are AlN layers. The thicknesses of the first member 11 and the second member 12 each are 2.02 μm.

In the simulation, the carrier concentrations of the first member 11 and the second member 12 are modified. The concentration of the n-type impurity is not always the same as the carrier concentration of the n-type impurity. For example, a portion of the n-type impurity is activated. The carriers (the electrons) are obtained due to the activated n-type impurity. In FIG. 3, the horizontal axis corresponds to a carrier concentration CC (/cm³). The vertical axis corresponds to a current density Jt (A/cm²). For example, the current density Jt corresponds to the density of the thermion current.

As shown in FIG. 3, a high current density Jt is obtained when the carrier concentration CC is high. For example, a high current density Jt is obtained reliably and easily when the carrier concentration CC is $1\times10^{16}/cm^3$ or more. The carrier concentration CC may be $1\times10^{17}/cm^3$ or more. The carrier concentration CC may be $1\times10^{18}/cm^3$ or more.

The relationship between the concentration of the n-type impurity and the carrier concentration of the n-type impurity is not always constant. An example of the relationship between the concentration of the n-type impurity and the carrier concentration of the n-type impurity will now be described.

Figure 4:
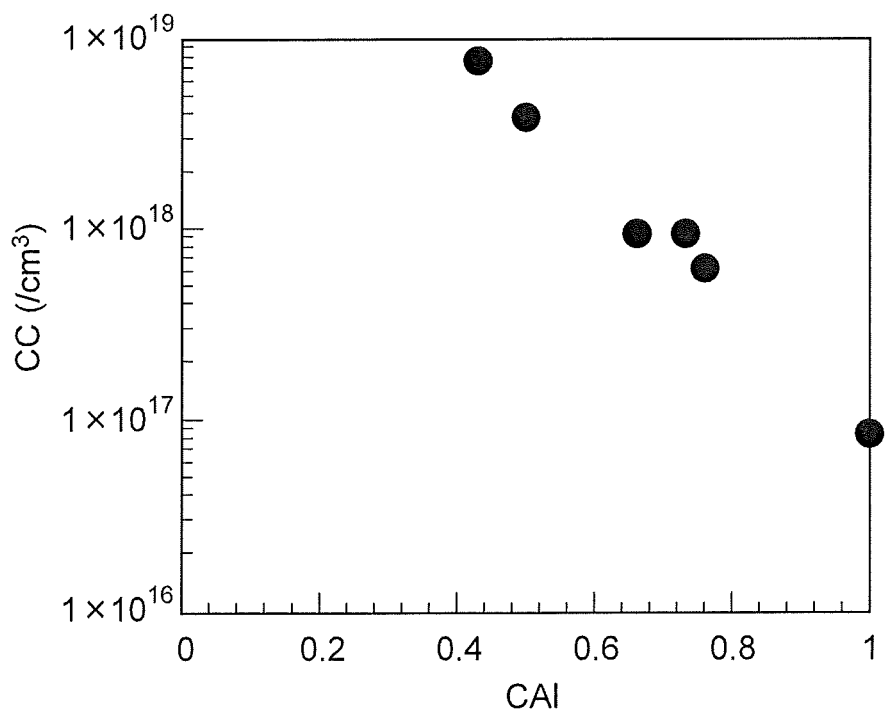
FIG. 4 is a graph illustrating a characteristic of the power generation element.

FIG. 4 is a graph illustrating a characteristic of the power generation element.

In FIG. 4, the horizontal axis is an Al composition ratio CAl of the AlGaN layer. The vertical axis is the maximum carrier concentration CC (/cm³) obtained in the AlGaN layer having the Al composition ratio CAl. As shown in FIG. 4, the maximum carrier concentration CC decreases as the Al composition ratio CAl increases.

It is considered that this is caused by, for example, the difference between the ionization energies, a self-compensation effect, etc.

Thus, the relationship between the concentration of the n-type impurity and the carrier concentration CC of the n-type impurity is dependent on the Al composition ratio. The maximum carrier concentration CC that is obtained for a high Al composition ratio is lower than the maximum carrier concentration CC obtained for a low Al composition ratio.

For example, a high carrier concentration CC is obtained by setting the Al composition ratio CAl to be somewhat low. For example, a high carrier concentration of $5\times10^{17}/cm^3$ or more is obtained when the Al composition ratio CAl is 0.7 or less.

For example, it is favorable for the composition ratio x1 (the Al composition ratio) in the first region r1 to be 0.7 or less. Thereby, a high carrier concentration is obtained. For example, the carrier concentration CC in the first region r1 is $1\times10^{16}/cm^3$ or more. For example, the carrier concentration CC in the first region r1 may be $1\times10^{17}/cm^3$ or more.

For example, the carrier concentration CC in the first region r1 may be $5 \times 10^{16}/cm^3$ or more.

The carrier concentration CC in the first region r1 may be higher than the carrier concentration CC in the second region r2. By setting the carrier concentration CC in the first region r1 to be high, for example, good contact characteristics are obtained easily between the first region r1 and the first conductive layer E1.

The concentration of the n-type impurity (the at least one element selected from the group consisting of Si, Ge, Te, and Sn) in the second region r2 may be higher than the concentration of the n-type impurity element in the first region r1.

In one example, the composition ratio x2 (the Al composition ratio) in the second region r2 is, for example, 0.8 or more. The electron affinity is small; and the electrons 51 are emitted easily.

For example, the composition ratio y1 (the Al composition ratio) in the first opposing region p1 of the second member 12 may be 0.7 or less. For example, the carrier concentration CC in the first opposing region p1 may be $1 \times 10^{16}/cm^3$ or more. For example, the carrier concentration CC in the first opposing region p1 may be $1 \times 10^{17}/cm^3$ or more. For example, the carrier concentration CC in the first opposing region p1 may be $5 \times 10^{16}/cm^3$ or more.

The carrier concentration CC in the first opposing region p1 may be higher than the carrier concentration CC in the second opposing region p2. The concentration of the n-type impurity (the at least one element selected from the group consisting of Si, Ge, Te, and Sn) in the second opposing region p2 may be higher than the concentration of the n-type impurity element in the first opposing region p1. In one example, the composition ratio y2 (the Al composition ratio) in the second opposing region p2 may be, for example, 0.8 or more.

As described above in reference to FIG. 1C, the first member 11 may include the third region r3 including $Al_{x3}Ga_{1-x3}N$ (x1<x3<x2). The third region r3 is provided between the first region r1 and the second region r2. The second member 12 may include the third opposing region p3 including $Al_{y3}Ga_{1-y3}N$ (y1<y3<y2). The third opposing region p3 is provided between the first opposing region p1 and the second opposing region p2.

Several examples of the first member 11 will now be described.

FIG. 5A to FIG. 5D are graphs illustrating the power generation element according to the first embodiment. These figures schematically show examples of profiles of the Al composition ratio CAl of the first member 11. In these figures, the horizontal axis is the position pZ in the Z-axis direction. The vertical axis is the Al composition ratio CAl.

Figure 5A:
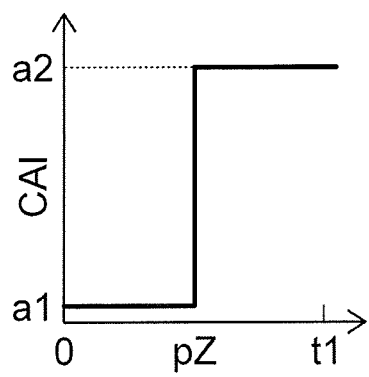
FIG. 5A to FIG. 5D are graphs illustrating the power generation element according to the first embodiment.

In FIG. 5A, the Al composition ratio CAl includes two regions. The Al composition ratio CAl is a value a1 in one of the two regions. The Al composition ratio CAl is a value a2 in the other one of the two regions. For example, the region that has the value a1 corresponds to the first region r1. For example, the region that has the value a2 corresponds to the second region r2. The value a1 is lower than the value a2. The value a1 may be, for example, 0. The value a2 may be, for example, 1.

Figure 5B:
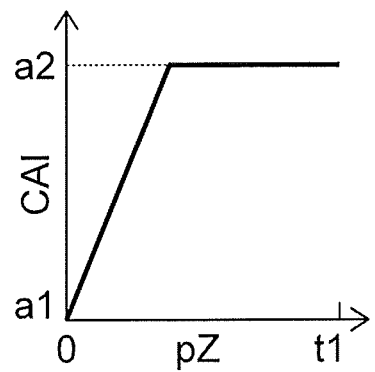

In FIG. 5B as well, the Al composition ratio CAl includes two regions. In one of the two regions, the Al composition ratio CAl increases from the value a1 toward the value a2. In the other one of the two regions, the Al composition ratio CAl is the value a2. For example, the region of the former corresponds to the first region r1; and the region of the latter corresponds to the second region r2. Thus, the Al composition ratio CAl may change in the first region r1.

Figure 5C:
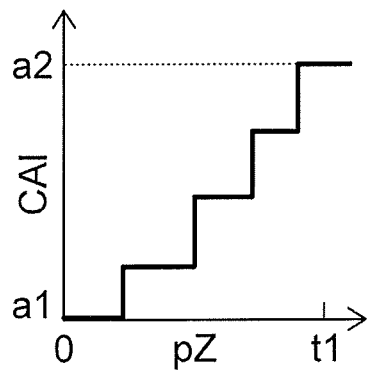

As shown in FIG. 5C, three or more regions may be provided in the Al composition ratio CAl. The Al composition ratio CAl may increase in a step configuration in the three or more regions. In the example, the number of regions is 5. The number of regions is arbitrary in the embodiment. For example, the region that has the value a1 can be considered to correspond to the first region r1; and the region that has the value a2 can be considered to correspond to the second region r2. Any region that is between the first region r1 and the second region r2 can be considered to be the third region r3.

Figure 5D:
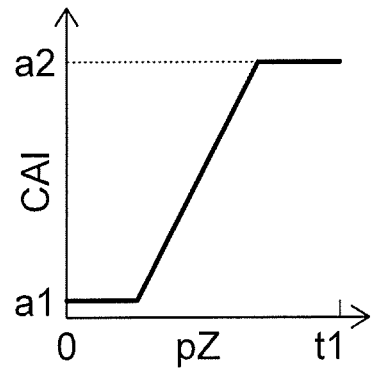

As shown in FIG. 5D, three or more regions may be provided in the Al composition ratio CAl; and the Al composition ratio CAl may change in at least one of the three or more regions.

For example, the first member 11 includes Al, Ga, and N. The Al composition ratio CAl in at least a portion of the first member 11 may increase in the orientation from the first conductive layer E1 toward the second conductive layer E2. For example, the second member 12 includes Al, Ga, and N. The Al composition ratio CAl in at least a portion of the second member 12 may increase in the orientation from the second conductive layer E2 toward the first conductive layer E1.

The configuration that relates to the first member 11 illustrated in FIG. 5A to FIG. 5D is applicable to the second member 12.

Second Embodiment

A second embodiment relates to a method for manufacturing a power generation element. For example, the power generation element 110 or 111 according to the first embodiment can be manufactured by the manufacturing method.

FIG. 6A to FIG. 6E are schematic cross-sectional views illustrating the method for manufacturing the power generation element according to the second embodiment.

Figure 6A:
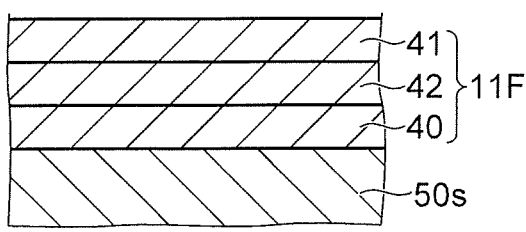
FIG. 6A to FIG. 6E are schematic cross-sectional views illustrating a method for manufacturing a power generation element according to a second embodiment.

As shown in FIG. 6A, a first film 11F is formed on a base body 50s. The first film 11F is used to form at least one of the first member 11 or the second member 12. In the example, the first film 11F includes an intermediate film 40, a second film 42, and a first film 41. The intermediate film 40 is provided between the base body 50s and the first film 41. The second film 42 is provided between the intermediate film 40 and the first film 41.

For example, a Si substrate, an $Al_2O_3$ substrate, a SiC substrate, or the like is used as the base body 50s. The intermediate film 40 is, for example, an AlN film having a low impurity concentration. The second film 42 is used to form the second region r2. The first film 41 is used to form the first region r1. The second film 42 is, for example, an AlN film including an n-type impurity. The first film 41 is, for example, an AlGaN film including an n-type impurity. Other films may be provided between the first film 41 and the second film 42. The other films may be, for example, the third region r3, etc.

For example, crystal growth of the first film 11F is performed using metal organic chemical vapor deposition (MOCVD), etc. The first film 11F may be formed by crystal growth using molecular beam epitaxy (MBE), etc.

The first film 11F that is provided on the base body 50s is, for example, a crystal of a nitride semiconductor. The front surface (the upper surface) of the first film 11F is, for example, the +c plane. The lower surface of the first film 11F (the surface on the base body 50s side) is the −c plane.

Figure 6B:
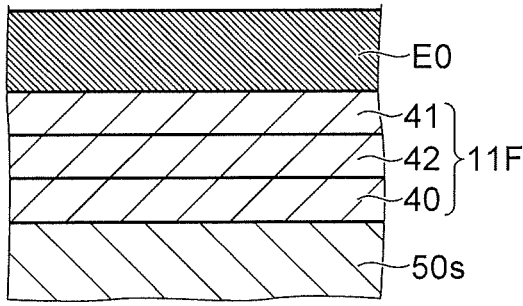

As shown in FIG. 6B, a conductive layer E0 is formed on the first film 11F. The conductive layer E0 is used to form at least one of the first conductive layer E1 or the second conductive layer E2. The conductive layer E0 includes, for example, at least one selected from the group consisting of Mo and W. For example, the conductive layer E0 is formed by vapor deposition. For example, the conductive layer E0 may be Mo or W having a wafer configuration. In such a case, for example, the conductive layer E0 is bonded to the first film 11F.

Figure 6C:
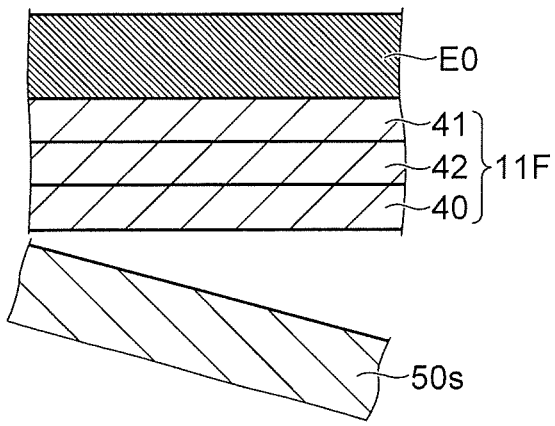

The base body 50s is removed as shown in FIG. 6C. The intermediate film 40 also is removed.

Figure 6D:
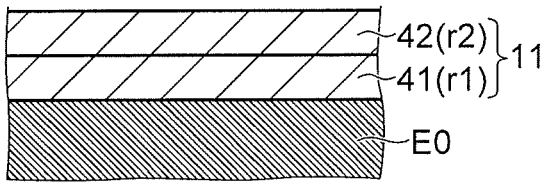

As shown in FIG. 6D, the first region r1 is obtained from the first film 41; and the second region r2 is obtained from the second film 42.

The surface of the first film 11F is, for example, the −c plane. Such a structure body including the conductive layer E0 and the first film 11F is multiply prepared. In one of the multiple structure bodies, the conductive layer E0 is used as the first conductive layer E1; and the first film 11F is used as the first member 11. In another one of the multiple structure bodies, the conductive layer E0 is used as the second conductive layer E2; and the first film 11F is used as the second member 12.

Figure 6E:
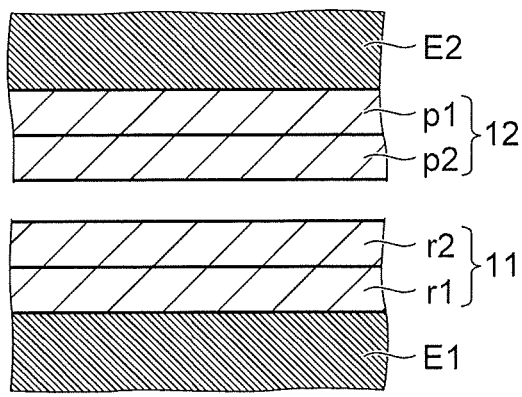

As shown in FIG. 6E, the first member 11 and the second member 12 are combined with each other so that the first member 11 and the second member 12 oppose each other. Thereby, the power generation element 110 according to the embodiment is made.

Figure 7A:
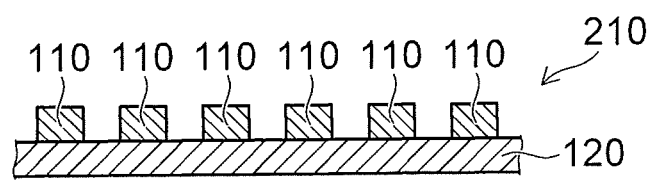
FIG. 7A and FIG. 7B are schematic cross-sectional views showing a power generation device and a power generation module according to the embodiment.
Figure 7B:
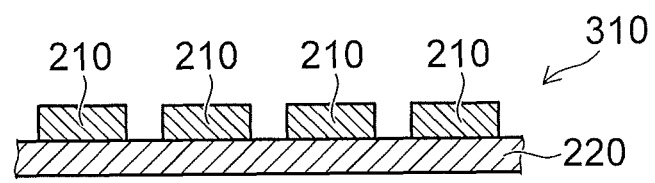

FIG. 7A and FIG. 7B are schematic cross-sectional views showing a power generation device and a power generation module according to the embodiment.

As shown in FIG. 7A, the power generation module 210 according to the embodiment includes the power generation element 110 according to the first embodiment. In the example, multiple power generation elements 110 are arranged on a substrate 120. The power generation element 111 may be used instead of the power generation element 110.

As shown in FIG. 7B, the power generation device 310 according to the embodiment includes the power generation module 210 recited above. Multiple power generation modules 210 may be provided. In the example, the multiple power generation modules 210 are arranged on a substrate 220.

Figure 8A:
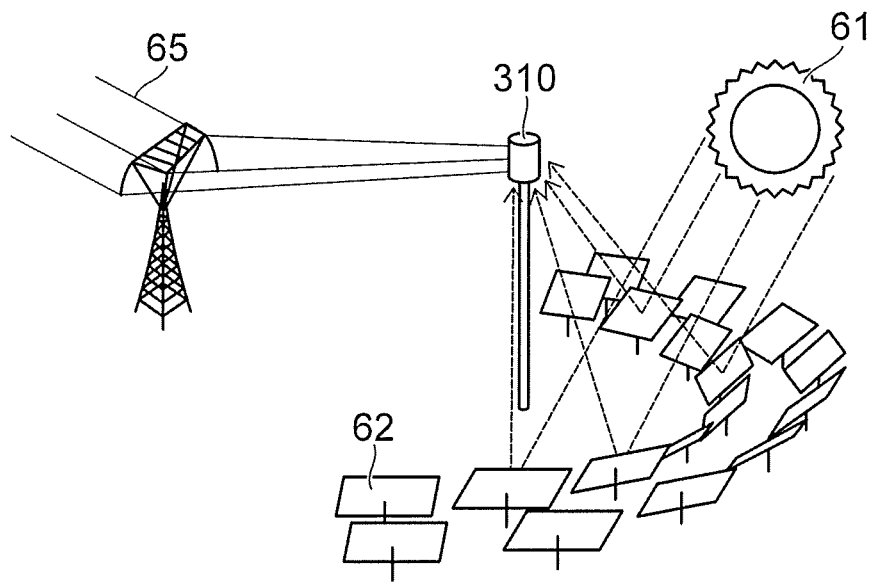
FIG. 8A and FIG. 8B are schematic views showing the power generation system and the power generation device according to the embodiment.
Figure 8B:
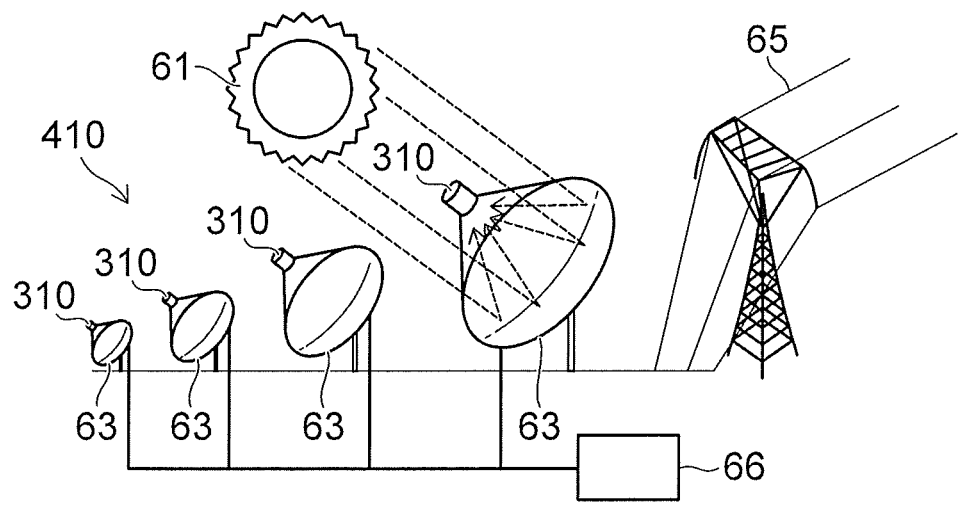

FIG. 8A and FIG. 8B are schematic views showing the power generation system and the power generation device according to the embodiment.

As shown in FIG. 8A and FIG. 8B, the power generation device 310 according to the embodiment (i.e., the power generation element 110 or the power generation module 210 according to the first embodiment) is applicable to solar thermal power generation.

As shown in FIG. 8A, for example, the light from the sun 61 is reflected by a heliostat 62 and is incident on the power generation device 310 (the power generation element 110 or the power generation module 210). The light causes the first temperature T1 of the first conductive layer E1 and the first member 11 to increase. The first temperature T1 becomes higher than the second temperature T2. The heat is converted into a current. The current is transmitted by a power line 65, etc.

As shown in FIG. 8B, for example, the light from the sun 61 is concentrated by a concentrating mirror 63 and is incident on the power generation device 310 (the power generation element 110 or the power generation module 210). The heat due to the light is converted into a current. The current is transmitted by the power line 65, etc.

For example, the power generation system 410 includes the power generation device 310. In the example, multiple power generation devices 310 are provided. In the example, the power generation system 410 includes the power generation devices 310 and a drive device 66. The drive device 66 causes the power generation devices 310 to follow the movement of the sun 61. Efficient power generation can be performed by following the sun 61.

Highly efficient power generation can be performed by using the power generation element 110 or 111 according to the embodiment or the like.

According to the embodiments, a power generation element, a power generation module, a power generation device, and a power generation system can be provided in which the efficiency can be increased.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in power generation elements such as conductive layers, members, terminals, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all power generation elements, power generation modules, power generation devices, and power generation systems practicable by an appropriate design modification by one skilled in the art based on the power generation elements, the power generation modules, the power generation devices, and the power generation systems described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A power generation element, comprising:
a first conductive layer;
a second conductive layer;

a first member provided between the first conductive layer and the second conductive layer; and a second member separated from the first member and provided between the first member and the second conductive layer, a gap being provided between the first member and the second member, the first member including a first region including $Al_{x1}Ga_{1-x1}N$ ($0 \leq x1 < 1$), and a second region including $Al_{x2}Ga_{1-x2}N$ ($x1 < x2 \leq 1$) and being provided between the first region and the second member, a <000-1> direction of the first member having a component in an orientation from the first conductive layer toward the second conductive layer.

2. The power generation element according to claim 1, wherein the first member has a first surface opposing the second member, and the first surface is a (000-1) plane.

3. The power generation element according to claim 1, wherein the first member further includes a third region including $Al_{x3}Ga_{1-x3}N$ ($x1 < x3 < x2$), and the third region is provided between the first region and the second region.

4. The power generation element according to claim 1, wherein the first member includes Al, Ga, and N, and an Al composition ratio in at least a portion of the first member increases in the orientation from the first conductive layer toward the second conductive layer.

5. The power generation element according to claim 1, wherein the second member includes:

a first opposing region including $Al_{y1}Ga_{1-y1}N$ ($0 \leq y1 < 1$); and a second opposing region including $Al_{y2}Ga_{1-y2}N$ ($y1 < y2 \leq 1$) and being provided between the first opposing region and the first member, and a <000-1> direction of the second member has a component in an orientation from the second conductive layer toward the first conductive layer.

6. The power generation element according to claim 5, wherein the second member has a second surface opposing the first member, and the second surface is a (000-1) plane.

7. The power generation element according to claim 5, wherein the second member further includes a third opposing region including $Al_{y3}Ga_{1-y3}N$ ($y1 < y3 < y2$), and the third opposing region is provided between the first opposing region and the second opposing region.

8. The power generation element according to claim 5, wherein the second member includes Al, Ga, and N, and an Al composition ratio in at least a portion of the second member increases in the orientation from the second conductive layer toward the first conductive layer.

9. The power generation element according to claim 1, wherein the first region includes at least one element selected from the group consisting of Si, Ge, Te, and Sn.

10. The power generation element according to claim 9, wherein a concentration of the at least one element in the second region is higher than a concentration of the element in the first region.

11. The power generation element according to claim 1, wherein a carrier concentration in the first region is higher than a carrier concentration in the second region.

12. The power generation element according to claim 1, wherein x1 is 0.7 or less, and a carrier concentration in the first region is $1 \times 10^{16}/cm^3$ or more.

13. The power generation element according to claim 1, wherein x2 is 0.8 or more.

14. The power generation element according to claim 1, wherein at least a portion of the second member includes at least one selected from the group consisting of Si, Ge, Te, and Sn.

15. The power generation element according to claim 1, wherein the first member is electrically connected to the first conductive layer, and the second member is electrically connected to the second conductive layer.

16. The power generation element according to claim 1, wherein when a temperature of the first member is higher than a temperature of the second member, electrons are emitted from the first member, and the electrons reach the second member.

17. A power generation module, comprising a plurality of the power generation elements according to claim 1.

18. A power generation device, comprising a plurality of the power generation modules according to claim 17.

19. A power generation system, comprising:

the power generation device according to claim 18; and a drive device, the drive device causing the power generation device to follow a movement of the Sun.

* * * * *